(12) United States Patent
Adkins

(10) Patent No.: US 11,192,662 B2
(45) Date of Patent: Dec. 7, 2021

(54) AIRCRAFT INTEGRATED MODULAR AVIONICS INTER-PARTITION COMMUNICATIONS SIMULATION MODELING LANGUAGE EXTENSION

(71) Applicant: Kidde Technologies, inc., Wilson, NC (US)

(72) Inventor: Dana Eugene Adkins, Apex, NC (US)

(73) Assignee: KIDDE TECHNOLOGIES, INC., Wilson, NC (US)

( * ) Notice: Subject to any disclaimer, the term of this patent is extended or adjusted under 35 U.S.C. 154(b) by 496 days.

(21) Appl. No.: 16/188,512

(22) Filed: Nov. 13, 2018

(65) Prior Publication Data

US 2020/0148390 A1    May 14, 2020

(51) Int. Cl.
| | |
|---|---|
| *G06F 30/20* | (2020.01) |
| *G06F 30/3308* | (2020.01) |
| *B64F 5/00* | (2017.01) |
| *G06F 30/15* | (2020.01) |

(52) U.S. Cl.
CPC ............... *B64F 5/00* (2013.01); *G06F 30/15* (2020.01); *G06F 30/20* (2020.01); *G06F 30/3308* (2020.01)

(58) Field of Classification Search
CPC .......... G06F 30/15; G06F 2111/20; G06F 2119/18; G06F 8/34; G06F 8/35; G06F 30/3308
See application file for complete search history.

(56) References Cited

U.S. PATENT DOCUMENTS

| | | | |
|---|---|---|---|
| 8,543,263 B2 | 9/2013 | Danielsson et al. | |
| 8,788,249 B2* | 7/2014 | Li | G01C 19/38 703/7 |
| 8,812,284 B2 | 8/2014 | Damiani et al. | |
| 9,063,800 B2* | 6/2015 | McCready | G06F 9/541 |
| 10,050,765 B2 | 8/2018 | Van Stensel et al. | |
| 2007/0288885 A1* | 12/2007 | Brunel | G06F 8/10 717/104 |
| 2011/0093250 A1* | 4/2011 | Lin | G01C 19/38 703/7 |
| 2011/0296379 A1* | 12/2011 | McCready | G06F 9/448 717/121 |
| 2013/0166271 A1 | 6/2013 | Danielsson et al. | |
| 2013/0179134 A1* | 7/2013 | Li | G01C 19/38 703/7 |

(Continued)

OTHER PUBLICATIONS

Corraro et al., "A novel approach for the development and coding of avionics functionalities for IMA architectures," IEEE, AIAA 37th Digital Avionics Systems Conference (DASC), Sep. 23, 2018, 8 pages.

(Continued)

*Primary Examiner* — Thai Q Phan
(74) *Attorney, Agent, or Firm* — Cantor Colburn LLP

(57) ABSTRACT

Systems and methods for implementing a modeling language extension for inter-partition communication are provided. Aspects include defining, by a modeling language, a simulation model, defining a simulation model extension, the simulation model extension comprising at least one sampling port communication module and at least one queueing port communication module, and adding the simulation model extension to the simulation model.

12 Claims, 4 Drawing Sheets

(56) References Cited

U.S. PATENT DOCUMENTS

| | | | | |
|---|---|---|---|---|
| 2013/0275940 A1* | 10/2013 | Park | ............................ | G06F 8/34 |
| | | | | 717/105 |
| 2014/0188311 A1* | 7/2014 | Masson | .................. | B64D 10/00 |
| | | | | 701/3 |
| 2014/0288896 A1* | 9/2014 | Li | ............................ | G06F 30/20 |
| | | | | 703/2 |
| 2017/0201367 A1* | 7/2017 | Stensel | ................. | G06F 3/0607 |
| 2019/0311087 A1* | 10/2019 | Jackson | ................. | G06F 30/15 |
| 2019/0385057 A1* | 12/2019 | Litichever | ................ | H04L 63/14 |
| 2020/0389469 A1* | 12/2020 | Litichever | ........... | H04L 63/1425 |

OTHER PUBLICATIONS

Delange et al., "Validate, simulate, and implement ARINC653 systems using AADL," ADA Letters, ACM, vol. 29, No. 3, Nov. 1, 2009, pp. 31-44.

Dubey et al., "A Real-Time Component Framework: Experience with CCM and ARINC-653," 2010 13th IEEE International Sumposium on Object/Component/Service-Oriented Real-Time Distributed Computing (ISORC), May 5, 2010, pp. 143-150.

Zhao et al., "Event-based formalization of safety-critical operating system standards: An experience report on ARINC 653 using Event-B," 2015 IEEE 26th International Symposium on Software Realiability Engineering (ISSRE), Nov. 2, 2015, pp. 281-292.

\* cited by examiner

AIRCRAFT INTEGRATED MODULAR AVIONICS INTER-PARTITION COMMUNICATIONS SIMULATION MODELING LANGUAGE EXTENSION

BACKGROUND

Exemplary embodiments pertain to communications between aircraft systems and more particularly to inter-partition communications simulation modeling language extension for aircraft systems simulations.

During systems and software model based design, it can be advantageous to communicate within models in a way that mimics the underlying software architecture that will exist on an aircraft. Because aircraft and other large modular systems require a large number of resources to construct, some manufacturers have turned to software modeling based design to test the function of the different systems within an aircraft before beginning construction. Typically, this model based design simulates the individual systems present on the aircraft but does not use a standardized communications scheme between each system.

BRIEF DESCRIPTION

Disclosed is a system. The system includes a processor communicatively coupled to a memory, the processor configured to define, by a modeling language, a simulation model, define a simulation model extension, the simulation model extension comprising at least one sampling port communication module and at least one queueing port communication module, and add the simulation model extension to the simulation model.

In addition to one or more of the features described above, or as an alternative to any of the foregoing embodiments, further embodiments may include that the processor is further configured to run a simulation using the simulation model extension and the simulation model.

In addition to one or more of the features described above, or as an alternative to any of the foregoing embodiments, further embodiments may include that the simulation model comprises a model in the loop (MIL) simulation.

In addition to one or more of the features described above, or as an alternative to any of the foregoing embodiments, further embodiments may include that the simulation model comprises a software in the loop (SIL) simulation.

In addition to one or more of the features described above, or as an alternative to any of the foregoing embodiments, further embodiments may include that the simulation model comprises a plurality of partitions.

In addition to one or more of the features described above, or as an alternative to any of the foregoing embodiments, further embodiments may include that the plurality of partitions comprise function specific modules.

In addition to one or more of the features described above, or as an alternative to any of the foregoing embodiments, further embodiments may include that the simulation model extension can be accessed by each of the plurality of partitions.

In addition to one or more of the features described above, or as an alternative to any of the foregoing embodiments, further embodiments may include that the plurality of partitions access the simulation model extension by subscribing to the at least one sampling port.

In addition to one or more of the features described above, or as an alternative to any of the foregoing embodiments, further embodiments may include that the plurality of partitions access the simulation model extension by subscribing to the at least one queueing port.

In addition to one or more of the features described above, or as an alternative to any of the foregoing embodiments, further embodiments may include that the processor is further configured to cause at least one component of the system to be manufactured based at least in part on one or more results of the simulation.

Also disclosed is a method. The method includes defining, by a modeling language, a simulation model, defining a simulation model extension, the simulation model extension comprising at least one sampling port communication module and at least one queueing port communication module, and adding the simulation model extension to the simulation model.

In addition to one or more of the features described above, or as an alternative to any of the foregoing embodiments, further embodiments of the method may include running a simulation using the simulation model extension and the simulation model.

In addition to one or more of the features described above, or as an alternative to any of the foregoing embodiments, further embodiments of the method may include that the simulation model comprises a model in the loop (MIL) simulation.

In addition to one or more of the features described above, or as an alternative to any of the foregoing embodiments, further embodiments of the method may include that the simulation model comprises a software in the loop (SIL) simulation.

In addition to one or more of the features described above, or as an alternative to any of the foregoing embodiments, further embodiments of the method may include that the simulation model comprises a plurality of partitions.

In addition to one or more of the features described above, or as an alternative to any of the foregoing embodiments, further embodiments of the method may include that the plurality of partitions comprise functional specific modules.

In addition to one or more of the features described above, or as an alternative to any of the foregoing embodiments, further embodiments of the method may include that the simulation model extension can be accessed by each of the plurality of partitions.

In addition to one or more of the features described above, or as an alternative to any of the foregoing embodiments, further embodiments of the method may include that the plurality of partitions access the simulation model extension by subscribing to the at least one sampling port.

In addition to one or more of the features described above, or as an alternative to any of the foregoing embodiments, further embodiments of the method may include causing at least one component of the system to be manufactured based at least in part on one or more results of the simulation.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
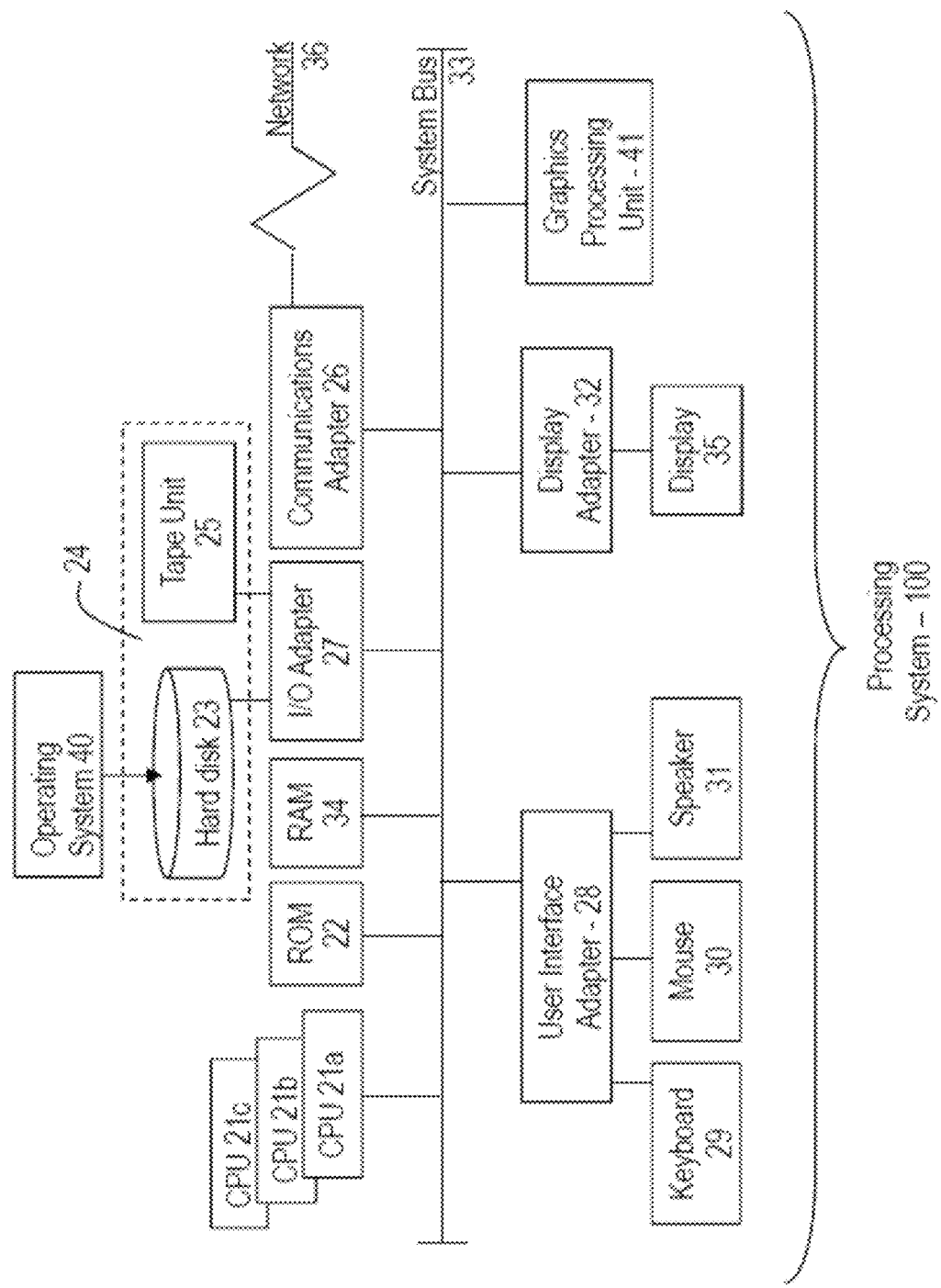
FIG. 1 depicts a block diagram of a computer system for use in implementing one or more embodiments of the disclosure.

Referring to FIG. 1, there is shown an embodiment of a processing system 100 for implementing the teachings herein. In this embodiment, the system 100 has one or more central processing units (processors) 21a, 21b, 21c, etc. (collectively or generically referred to as processor(s) 21). In one or more embodiments, each processor 21 may include a reduced instruction set computer (RISC) microprocessor. Processors 21 are coupled to system memory 34 (RAM) and various other components via a system bus 33. Read only memory (ROM) 22 is coupled to the system bus 33 and may include a basic input/output system (BIOS), which controls certain basic functions of system 100.

FIG. 1 further depicts an input/output (I/O) adapter 27 and a network adapter 26 coupled to the system bus 33. I/O adapter 27 may be a small computer system interface (SCSI) adapter that communicates with a hard disk 23 and/or tape storage drive 25 or any other similar component. I/O adapter 27, hard disk 23, and tape storage device 25 are collectively referred to herein as mass storage 24. Operating system 40 for execution on the processing system 100 may be stored in mass storage 24. A network communications adapter 26 interconnects bus 33 with an outside network 36 enabling data processing system 100 to communicate with other such systems. A screen (e.g., a display monitor) 35 is connected to system bus 33 by display adaptor 32, which may include a graphics adapter to improve the performance of graphics intensive applications and a video controller. In one embodiment, adapters 27, 26, and 32 may be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 all interconnected to bus 33 via user interface adapter 28, which may include, for example, a Super I/O chip integrating multiple device adapters into a single integrated circuit.

In exemplary embodiments, the processing system 100 includes a graphics processing unit 41. Graphics processing unit 41 is a specialized electronic circuit designed to manipulate and alter memory to accelerate the creation of images in a frame buffer intended for output to a display. In general, graphics processing unit 41 is very efficient at manipulating computer graphics and image processing and has a highly parallel structure that makes it more effective than general-purpose CPUs for algorithms where processing of large blocks of data is done in parallel. The processing system 100 described herein is merely exemplary and not intended to limit the application, uses, and/or technical scope of the present disclosure, which can be embodied in various forms known in the art.

Thus, as configured in FIG. 1, the system 100 includes processing capability in the form of processors 21, storage capability including system memory 34 and mass storage 24, input means such as keyboard 29 and mouse 30, and output capability including speaker 31 and display 35. In one embodiment, a portion of system memory 34 and mass storage 24 collectively store an operating system coordinate the functions of the various components shown in FIG. 1. FIG. 1 is merely a non-limiting example presented for illustrative and explanatory purposes.

Turning now to an overview of technologies that are more specifically relevant to aspects of the disclosure, ARINC 653 is a software specification for space and time partitioning in safety-critical avionics real-time operating system (RTOS). It allows the hosting of multiple applications of different software criticality levels on the same hardware in the context of an integrated modular avionics architecture. For integrated modular avionics, a common computing platform provides a concurrency of operation where each application partition is allocated a certain number of milliseconds of execution time through a cycle. The modular nature provides for many partitions where, for example, a radio system is assigned to one partition, a fire protection system is assigned to another partition, and a navigation system, for example, is assigned yet another partition. Each partition is allocated a time slice in the operating system. In order to decouple the real-time operating system platform from the application software, the ARINC 653 defines an application programming interface (API) called Application Executive (APEX).

Turning now to an overview of the aspects of the disclosure, an ARINC 653 APEX API for inter-partition communications using sampling and queueing ports as an extension to a modeling language is provided. An extension is a software component that adds a specific feature to an existing computer program. During systems and software model based design, communicating within models in a way that mimics the underlying software architecture can be advantageous. Embodiments provide fidelity to Model in the Loop (MIL) simulations and Software in the Loop (SIL) simulations. Also, embodiments includes an encoding/decoding of model data signals generated into/from the targeted communications data structures as defined by ARINC 653 avionics application software standard interface. In essence, a modeling language extension is provided that mimics the underlying software architecture for ARINC-653 APEX API for inter-partition communications.

Figure 2A:
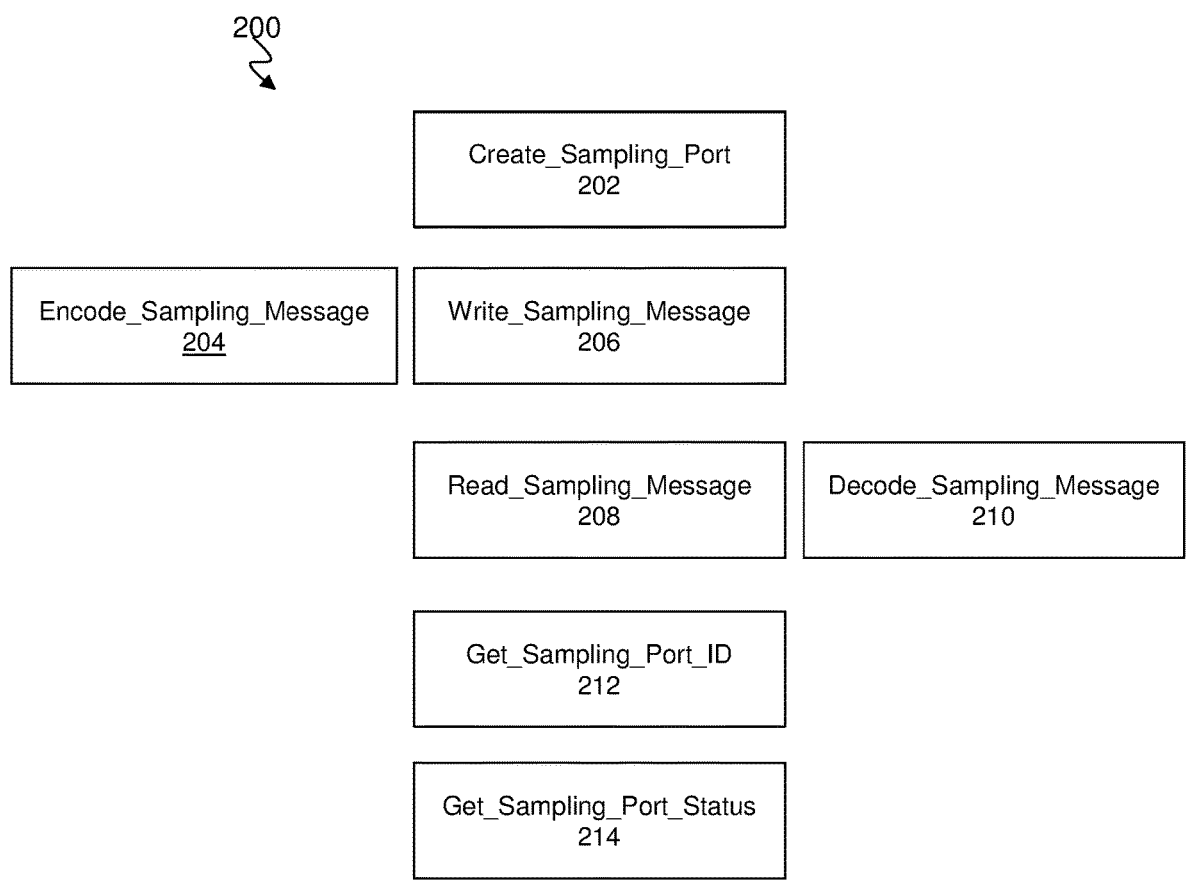
FIG. 2a depicts a software extension for inter-partition communications according to one or more embodiments of the disclosure.

Turning now to a more detailed description of aspects of the present invention, FIG. 2a depicts a software extension 200 for inter-partition communications according to one or more embodiments.

The software extension 200 sampling port create service request 202 given a sampling port name, maximum message size, port direction, and refresh period, will create the underlying data structures necessary to support the other sampling port facilities of the software extension 200 as well as assign and return a unique sampling port identifier and a return code containing indication of any errors. This sampling port create service request 202 will mimic the ARINC 653 CREATE_SAMPLING_PORT service request in the modeled environment.

The software extension 200 sampling message encode facility 204 given separate model application dependent data signals will combine them into a message reference for subsequent input to the software extension 200 sampling message write service request 206.

The software extension 200 sampling message write service request 206 given a sampling port identifier, message reference, and message length, will write the message to the sampling port as well as return a return code containing indication of any errors. This sampling message write service request 206 will mimic the ARINC 653 WRITE_SAMPLING_MESSAGE service request in the modeled environment.

The software extension 200 sampling message read service request 208 given a sampling port identifier and message reference, will read the sampling port message and return the message length, message validity, and a return code containing indication of any errors. This sampling message read service request 208 will mimic the ARINC 653 READ_SAMPLING_MESSAGE service request in the modeled environment.

The software extension 200 sampling message decode facility 210 given a model reference obtained from software extension 200 sampling message read service request 208 will decode a message into separate model application dependent data signals.

The software extension 200 sampling port get port identifier service request 212 given a sampling port name will return the sampling port identifier and a return code containing indication of any errors. This sampling port get port identifier service request 212 will mimic the ARINC 653 GET_SAMPLING_PORT_ID service request in the modeled environment.

The software extension 200 sampling port get port status service request 214 given a sampling port identifier will return the sampling port status and a return code containing indication of any errors. This sampling port get port status service request 214 will mimic the ARINC 653 GET_SAMPLING_PORT_STATUS service request in the modeled environment.

The software extension 200 sampling message encode facility 204 and the software extension 200 sampling message decode facility 210 provide for a method of translation between the model signal data and the software extension 200 sampling port write and read service requests.

Figure 2B:
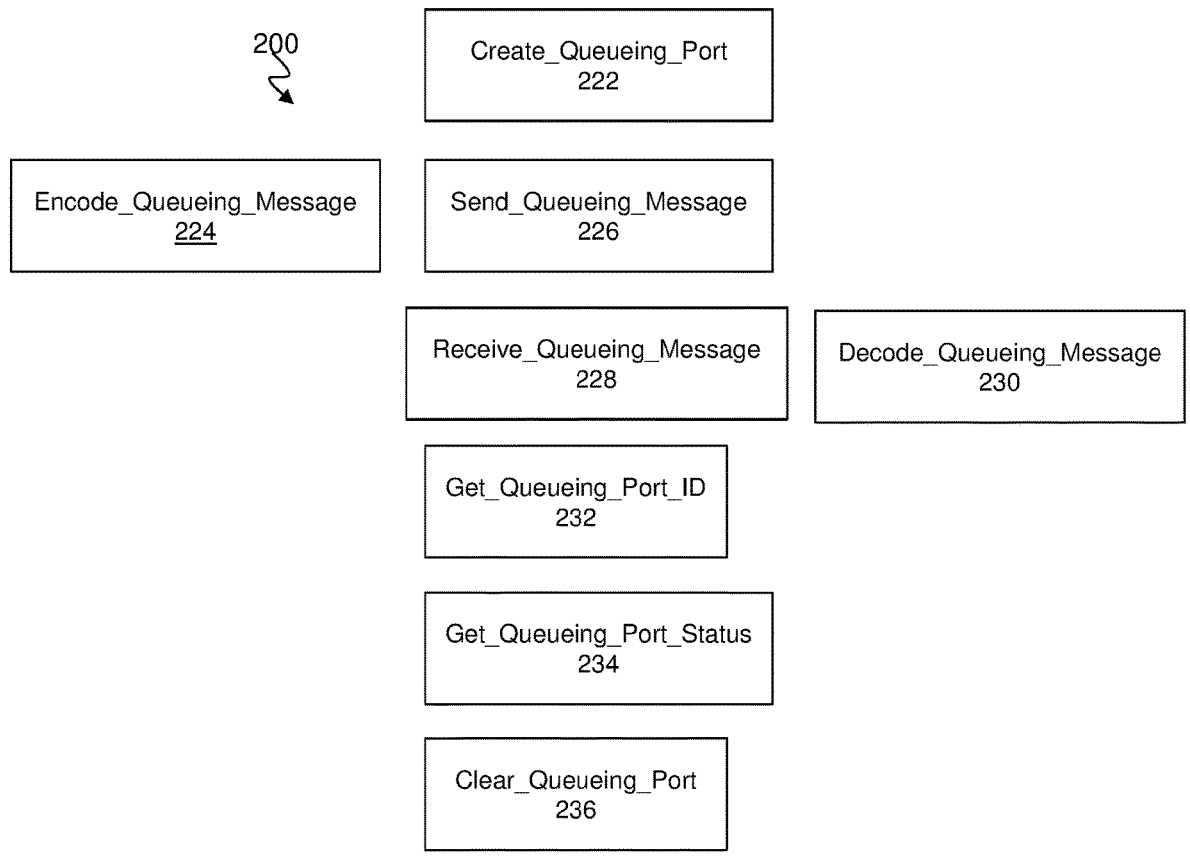
FIG. 2b depicts a software extension for inter-partition communications according to one or more embodiments of the disclosure.

FIG. 2b depicts the software extension 200 for inter-partition communications according to one or more embodiments.

The software extension 200 queueing port create service request 222 given a queueing port name, maximum size, message range, port direction, and queuing discipline, will create the underlying data structures necessary to support the other queueing port facilities of the software extension 200 as well as assign and return a unique sampling port identifier and a return code containing indication of any errors. This queueing port create service request 222 will mimic the ARINC 653 CREATE_QUEUING_PORT service request in the modeled environment.

The software extension 200 queueing message encode facility 224 given separate model application dependent data signals will combine them into a message reference for subsequent input to the software extension 200 queueing message send service request 226.

The software extension 200 queueing message send service request 226 given a queueing port identifier, message reference, message length, and timeout, will send the message to the queueing port as well as return a return code containing indication of any errors. This queueing message send service request 226 will mimic the ARINC 653 SEND_QUEUING_MESSAGE service request in the modeled environment.

The software extension 200 queueing message receive service request 228 given a sampling port identifier, message reference, length, and time out, will read the queueing port message and return the a return code containing indication of any errors. This queueing message receive service request 228 will mimic the ARINC 653 RECEIVE_QUEUING_MESSAGE service request in the modeled environment.

The software extension 200 queueing message decode facility 230 given a model reference obtained from software extension 200 queueing message receive service request 228 will decode a message into separate model application dependent data signals.

The software extension 200 queueing port get port identifier service request 232 given a queueing port name will return the sampling port identifier and a return code containing indication of any errors. This queueing port get port identifier service request 232 will mimic the ARINC 653 GET_QUEUING_PORT_ID service request in the modeled environment.

The software extension 200 queueing port get port status service request 234 given a sampling port identifier will return the queueing port status and a return code containing indication of any errors. This queueing port get port status service request 234 will mimic the ARINC 653 GET_QUEUING_PORT_STATUS service request in the modeled environment.

The software extension 200 queueing port clear service request 236 given a sampling port identifier will clear the indicated queue and return a return code containing indication of any errors. This queueing port clear service request 236 will mimic the ARINC 653 CLEAR_QUEUING_PORT service request in the modeled environment.

The software extension 200 queueing message encode facility 224 and the software extension 200 queueing message decode facility 230 provide for a method of translation between the model signal data and the software extension 200 queuing service requests.

In one or more embodiments, the software extension 200 can be implemented on a graphical programming environment such as, for example, SIMULINK™. The definition of a message structure for packing (encoding) and unpacking (decoding) can be implemented as a mask in SIMULINK™, for example. In one or more embodiments, the software extension 200 can be implemented using any of the components of the processing system 100 found in FIG. 1.

In one or more embodiments, the software extension 200 provides for a sampling mechanism for a simulation that can mimic the operations of aircraft systems interactions. Current modeling languages only provide for purely discrete signals or an aggregation of discrete signals that in no way mimics the message transmission discipline provided for by ARINC 653 between the different parts of the modeled partition. The software extension 200 allows the sampling ports to be sent a periodic/synchronous message which mimics the ARINC 653 definitions.

In one or more embodiments, the software extension 200 provides for a queuing mechanism for a simulation that can mimic the operations of aircraft systems interactions. Current modeling languages only provide for purely discrete signals or an aggregation of discrete signals that in no way mimics the first in first out queuing or priority queuing disciplines provided for by ARINC 653 between the different parts of the modeled partitions. The software extension 200 allows the queueing ports to be sent a burst of aperiodic/asynchronous messages without any of the messages being lost and the receiving ports are not required to read these messages in real time which mimics the ARINC 653 definitions.

In one or more embodiments, the software extension 200 can be implemented in a modeling/simulation software for the modeling/simulation of aircraft operations and assist with design of an aircraft. The results of the simulations can be used in manufacturing and design of aircraft components. For example, a simulation result might indicate an airflow issue within an exhaust system of an aircraft. This issue can be addressed by adjusting an airflow in various components in the exhaust system of the aircraft. The simulation results can thus be utilized for design and manufacturing components of the aircraft. Tolerances of some machinery can be adjusted automatically based on the results of the modeling/simulations. These tolerances can be later utilized for manufacturing of aircraft components.

Figure 3:
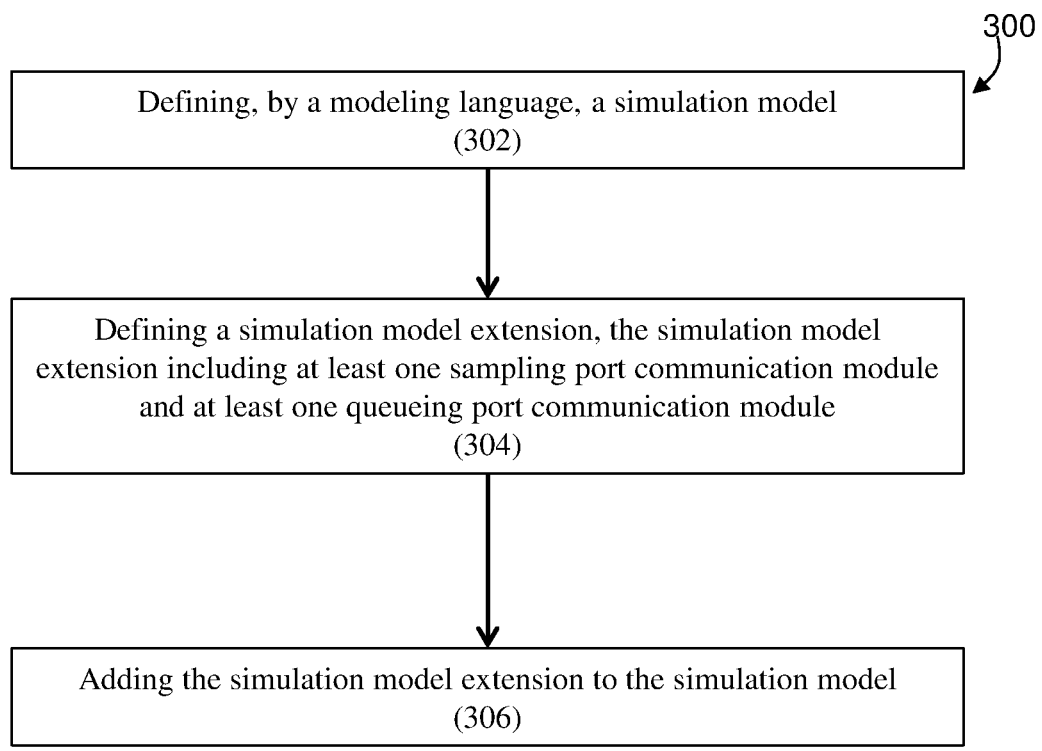
FIG. 3 is a process flow of a method in accordance with an embodiment of the disclosure.

FIG. 3 depicts a flow diagram of a method for modeling language extension for inter-partition communication according to one or more embodiments. The method 300 begins at process step 302 by defining, by a modeling language, a simulation model. At block 304, the method 300 includes defining a simulation model extension, the simulation model extension including at least one sampling port communication module and at least one queueing port communication module. And at block 306, the method 300 includes adding the simulation model extension to the simulation model.

Additional processes may also be included. It should be understood that the processes depicted in FIG. 3 represent illustrations and that other processes may be added or existing processes may be removed, modified, or rearranged without departing from the scope and spirit of the present disclosure.

In one or more embodiments, the queuing discipline can be either one of First In First Out (FIFO) or a Priority based queuing discipline.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method for enabling simulation of interactions among subsystems and between subsystems and a system during design by implementing a modeling language extension for inter-partition communication, the method comprising:
    defining, by a modeling language, a simulation model;
    defining a simulation model extension, the simulation model extension comprising:
        at least one sampling port communication module; and
        at least one queueing port communication module;
    adding the simulation model extension to the simulation model;
    running a simulation using the simulation model extension and the simulation model, wherein the simulation model comprises a software in a loop (SIL) simulation; and
    causing at least one component of the system to be manufactured based at least in part on one or more results of the simulation.

2. The method of claim 1, wherein the simulation model comprises a model in a loop (MIL) simulation.

3. The method of claim 1, wherein the simulation model comprises a plurality of partitions.

4. The method of claim 3, wherein the plurality of partitions comprise functional specific modules.

5. The method of claim 3, wherein the simulation model extension can be accessed by each of the plurality of partitions.

6. The method of claim 5, wherein the plurality of partitions access the simulation model extension by subscribing to the at least one sampling port.

7. A system for enabling simulation of interactions among subsystems and between subsystems and a system during design by implementing a modeling language extension for inter-partition communication, the system comprising:
    a processor communicatively coupled to a memory, the processor configured to:
        define, by a modeling language, a simulation model;
        define a simulation model extension, the simulation model extension comprising:
            at least one sampling port communication module; and
            at least one queueing port communication module;
        add the simulation model extension to the simulation model;
        run a simulation using the simulation model extension and the simulation model, wherein the simulation model comprises a software in a loop (SIL) simulation; and
        cause at least one component of the system to be manufactured based at least in part on one or more results of the simulation.

8. The system of claim 7, wherein the simulation model comprises a model in a loop (MIL) simulation.

9. The system of claim 7, wherein the simulation model comprises a plurality of partitions.

10. The system of claim 9, wherein the plurality of partitions comprise function specific modules.

11. The system of claim 9, wherein the simulation model extension can be accessed by each of the plurality of partitions.

12. The system of claim 11, wherein the plurality of partitions access the simulation model extension by subscribing to the at least one sampling port.

* * * * *